(12) United States Patent
Kosaka et al.

(10) Patent No.: US 12,124,162 B2
(45) Date of Patent: Oct. 22, 2024

(54) SUBSTRATE WITH FILM FOR REFLECTIVE MASK BLANK, REFLECTIVE MASK BLANK, AND METHOD FOR MANUFACTURING REFLECTIVE MASK

(71) Applicant: Shin-Etsu Chemical Co., Ltd., Tokyo (JP)

(72) Inventors: Takuro Kosaka, Joetsu (JP); Taiga Ogose, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 184 days.

(21) Appl. No.: 17/942,257

(22) Filed: Sep. 12, 2022

(65) Prior Publication Data

US 2023/0104571 A1 Apr. 6, 2023

(30) Foreign Application Priority Data

Oct. 1, 2021 (JP) .................................. 2021-162855

(51) Int. Cl.
| | | |
|---|---|---|
| *G03F 1/24* | (2012.01) | |
| *G03F 1/40* | (2012.01) | |
| *G03F 1/54* | (2012.01) | |
| *G03F 1/60* | (2012.01) | |

(52) U.S. Cl.
CPC .................. *G03F 1/24* (2013.01); *G03F 1/40* (2013.01); *G03F 1/54* (2013.01); *G03F 1/60* (2013.01)

(58) Field of Classification Search
None
See application file for complete search history.

(56) References Cited

U.S. PATENT DOCUMENTS

| | | |
|---|---|---|
| 2012/0009511 A1 | 1/2012 | Dmitriev |
| 2018/0149962 A1 | 5/2018 | Kobayashi et al. |
| 2019/0056653 A1 | 2/2019 | Kawahara et al. |
| 2019/0369483 A1 | 12/2019 | Ikebe et al. |
| 2019/0384157 A1 | 12/2019 | Ikebe et al. |

(Continued)

FOREIGN PATENT DOCUMENTS

| | | |
|---|---|---|
| JP | 2002-246299 A | 8/2002 |
| JP | 2012-22323 A | 2/2012 |

(Continued)

OTHER PUBLICATIONS

Communication and extended search report issued in the corresponding European Patent Application No. 22196919.9 on Feb. 21, 2023.

(Continued)

*Primary Examiner* — Martin J Angebranndt
(74) *Attorney, Agent, or Firm* — Birch, Stewart, Kolasch & Birch, LLP

(57) ABSTRACT

A substrate with a film for a reflective mask blank including a substrate, a multilayer reflection film and a back surface conductive film having a composition at the side in contact with the substrate and a different composition at the side remotest from the substrate is provided. The composition at the side in contact with the substrate contains silicon and nitrogen, as main components, and the different composition at the side remotest from the substrate contains tantalum, as a main component, and at least one element selected from the group consisting of silicon, germanium and aluminum.

12 Claims, 3 Drawing Sheets

(56) References Cited

U.S. PATENT DOCUMENTS

2021/0132487 A1\* 5/2021 Shin .......................... G03F 1/38
2022/0269161 A1   8/2022 Suzuki et al.
2024/0077797 A1\* 3/2024 Kosaka ..................... G03F 1/24

FOREIGN PATENT DOCUMENTS

KR          2009032802 A  \*  4/2009  ............... G03F 1/26
WO    WO 2021/044890 A1    3/2021

OTHER PUBLICATIONS

Decision to Grant a European Patent Pursuant to Article 97(1) EPC issued in the corresponding European Patent Application No. 22196919.9 on Mar. 7, 2024.

\* cited by examiner

SUBSTRATE WITH FILM FOR REFLECTIVE MASK BLANK, REFLECTIVE MASK BLANK, AND METHOD FOR MANUFACTURING REFLECTIVE MASK

CROSS-REFERENCE TO RELATED APPLICATION

This non-provisional application claims priority under 35 U.S.C. § 119(a) on Patent Application No. 2021-162855 filed in Japan on Oct. 1, 2021, the entire contents of which are hereby incorporated by reference.

TECHNICAL FIELD

The present invention relates to a substrate with a film for a reflective mask blank suitable for a reflective mask blank which is a material for a reflective mask used in manufacturing a semiconductor device such as an LSI, particularly, for an EUV mask blank which is a material for an EUV mask, relates to a reflective mask blank in which an absorber film is formed on a substrate with a film for a reflective mask blank, and relates to a method for manufacturing a reflective mask using a reflective mask blank.

BACKGROUND ART

In a manufacturing process of a semiconductor device, a photolithography technique in which a circuit pattern formed on a transfer mask is transferred onto a semiconductor substrate (a semiconductor wafer) through a reduction projection optical system with irradiating exposure light to the transfer mask is repeatedly used. Conventionally, a mainstream wavelength of the exposure light is 193 nm by argon fluoride (ArF) excimer laser light. A pattern with dimensions smaller than exposure wavelength has finally been formed by adopting a process called multi-patterning in which exposure processes and processing processes are combined multiple times.

However, since it is necessary to form a further fine pattern under continuous miniaturization of device patterns, an extreme ultraviolet (EUV) lithography technique using, as exposure light, extreme ultraviolet (EUV) light having a shorter wavelength less than the wavelength of ArF excimer laser light has been developed. The EUV light is light having a wavelength of, for example, about 10 to 20 nm, in particular, light having a wavelength of around 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask includes a multilayer reflection film that is formed on a substrate and reflects EUV light, and a patterned absorber film that is formed on the multilayer reflection film and absorbs EUV light. On the other hand, a material (including also a material in which a resist film is formed) before patterning the absorber film is called a reflective mask blank, and is used as a material for the reflective mask.

The reflective mask blank has a basic structure including a low-thermal expansion substrate, a multilayer reflection film that is formed on one surface of the two main surfaces of the substrate, and reflects EUV light, and an absorber film that is formed thereon and absorbs EUV light. As the multilayer reflection film, a multilayer reflection film in which molybdenum (Mo) layers and silicon (Si) layers are alternately laminated to obtain a necessary reflectance for EUV light is usually used. Further, as a protection film for protecting the multilayer reflection film, a ruthenium (Ru) film is formed on the multilayer reflection film. For the absorber film, a material containing tantalum (Ta) or the like, which has a relatively large extinction coefficient with respect to EUV light, is used (Patent Document 1: JP-A 2002-246299). On the other hand, a back surface conductive film is formed on the other main surface of the substrate. As the back surface conductive film, a metal nitride film has been proposed for electrostatic chucking, and a nitride film of chromium, tantalum, molybdenum or silicon is mainly exemplified.

CITATION LIST

Patent Document 1: JP-A 2002-246299
Patent Document 2: JP-A 2012-22323

SUMMARY OF THE INVENTION

It is required that the back surface conductive film has a low sheet resistance and a small surface roughness to apply electrostatic chucking. Further, the film stress of the back surface conductive film may assume function for reducing deformation of the substrate due to film stress that is caused by forming a multilayer reflection film or a protection film laminated on one main surface which is opposite across the substrate to the side at which the back surface conductive film is formed. In particular, a reflective mask blank will be heated to a temperature of 150 to 200° C. in processing to a reflective mask in some cases, and in consideration of this matter, the reflective mask blank is usually performed heat treatment in advance. However, when the heat treatment is performed, properties such as sheet resistance and film stress of the back surface conductive film may deteriorate after the heat treatment.

In addition, in pattern transfer using the reflective mask, a technique for improving displacement of transfer pattern in pattern transfer has been proposed in JP-A 2012-22323 (Patent Document 2). In this technique, a pulse laser having a wavelength of 400 to 800 nm is locally irradiated from the back surface side of the reflective mask to locally heat the substrate. To obtain a reflective mask blank which adapts to this technique, the back surface conductive film is needed to have a high transmittance with respect to light having a wavelength of 400 to 800 nm. Further, when the film stress of the back surface conductive film is increased in order to reduce the deformation of the substrate due to film stress that is caused by forming a multilayer reflection film or a protection film by the film stress of the back surface conductive film, a thick film is advantageous. However, a thin film is preferable from the viewpoint of productivity and suppressing generation of defects, thus, generally, it is advantageous that the back surface conductive film has a thickness of not more than 50 nm.

The present invention has been made to solve the above problems, and an object of the present invention is to provide a substrate with a film for a reflective mask blank and a reflective mask blank including a back surface conductive film that is a thinner film advantageous in productivity and suppressing generation of defects,
    a film having a high film stress advantageous for reducing, by the film stress of the back surface conductive film, deformation of the substrate due to film stress that is caused by forming a multilayer reflection film or a protection film laminated on one main surface which is opposite across the substrate to the side at which the back surface conductive film is formed, and/or a film having an advantage for locally heating the substrate, and having a high transmittance with respect to a wavelength of light used for heating. Further, the present invention is to provide a method for manufacturing a reflective mask with using the reflective mask blank.

The inventors have made earnestly studies to solve the above problems. As a result, in a reflective mask blank, when a multilayer reflection film or a multilayer reflection film and a protection film thereof are formed at the side of one main surface of the main surfaces of the substrate, and a back surface conductive film is formed at the side of the other main surface of the main surfaces of the substrate, the inventers found a back surface conductive film having a composition at the side in contact with the substrate, and a different composition at the side remotest from the substrate, in particular, having the composition at the side in contact with the substrate that contains silicon and nitrogen, as main components, and the different composition at the side remotest from the substrate that contains tantalum, as a main component.

Further, the inventers found that a substrate with a film for a reflective mask blank and a reflective mask blank including such a back surface conductive film have both of a thinness advantageous in productivity and suppressing generation of defects and a high film stress effective for reducing deformation of the substrate, and include a back surface conductive film having a high transmittance with respect to a wavelength of light which is used for heating the substrate.

In one aspect, the invention provides a substrate with a film for a reflective mask blank including a substrate, a multilayer reflection film formed at the side of one main surface of the two main surfaces of the substrate, and reflects EUV light, and a back surface conductive film formed in contact with the other main surface of the two main surfaces, wherein the back surface conductive film has a composition at the side in contact with the substrate, and a different composition at the side remotest from the substrate, the composition at the side in contact with the substrate is a composition consisting of silicon and nitrogen, a composition including silicon, nitrogen, and either or both of oxygen and carbon, and having a total content of silicon and nitrogen of not less than 70 at %, a composition including silicon, nitrogen, and at least one element selected from the group consisting of tantalum, molybdenum, chromium, titanium, zirconium, niobium, hafnium and tungsten, and having a total content of silicon and nitrogen of not less than 70 at %, or a composition including silicon and nitrogen, at least one element selected from the group consisting of tantalum, molybdenum, chromium, titanium, zirconium, niobium, hafnium and tungsten, and either or both of oxygen and carbon, and having a total content of silicon and nitrogen of not less than 70 at %, and the composition at the side remotest from the substrate is a composition including tantalum, and at least one element selected from the group consisting of silicon, germanium and aluminum, and having a tantalum content of not less than 60 at % and a total content of nitrogen and oxygen of not more than 15 at %.

Preferably, in the composition at the side in contact with the substrate, a content of nitrogen to the total of nitrogen and silicon is not less than 53 at %.

Preferably, the back surface conductive film has a thickness of not more than 50 nm.

Preferably, the back surface conductive film consists of a plurality of layers, and the layer at the side remotest from the substrate has a thickness of not less than 5 nm and not more than 20 nm.

Preferably, the back surface conductive film consists of a plurality of layers.

Preferably, the substrate with a film for a reflective mask blank further includes a protection film formed on the multilayer reflection film.

Preferably, in the substrate with a film for a reflective mask blank, the substrate has dimensions of 152 mm-square of the main surface and 6.35 mm of thickness, and an amount of change in warpage (ΔTIR) is within a range of −0.3 to +0.3 μm, wherein the amount of change in warpage (ΔTIR) is a difference between a warpage of the one main surface of the substrate before forming the multilayer reflection film or the multilayer reflection film and the protection film, and the back surface conductive film, on the substrate, and another warpage of the one main surface of the substrate after forming the multilayer reflection film or the multilayer reflection film and the protection film, and the back surface conductive film, on the substrate.

Preferably, in the substrate with a film for a reflective mask blank, the substrate has dimensions of 152 mm-square of the main surface and 6.35 mm of thickness, and an amount of change in warpage (ΔTIR) is within a range of −0.3 to +0.3 μm, wherein the amount of change in warpage (ΔTIR) is a difference between a warpage of the one main surface of the substrate before forming the multilayer reflection film or the multilayer reflection film and the protection film, and the back surface conductive film, on the substrate, and another warpage of the one main surface of the substrate after forming the multilayer reflection film or the multilayer reflection film and the protection film, and the back surface conductive film, on the substrate, and performing heat treatment at 150° C. for 10 minutes to the substrate.

Preferably, the back surface conductive film has a transmittance of not less than 10% with respect to light having a wavelength within a range of 400 to 800 nm.

Preferably, the back surface conductive film has a sheet resistance RS of not more than 250 Ω/square.

Preferably, the back surface conductive film has a surface roughness RMS of not more than 0.3 nm.

In another aspect, the invention provides a reflective mask blank in which an absorber film is formed on the multilayer reflection film of the substrate with a film for a reflective mask.

In the other aspect, the invention provides a method for manufacturing a reflective mask with using the reflective mask blank.

Advantageous Effects of the Invention

The back surface conductive film of the invention has a high film stress advantageous for reducing deformation of the substrate due to film stress that is caused by forming a multilayer reflection film or a protection film whereas the back surface conductive film is a thin film advantageous in productivity and suppressing generation of defects. The back surface conductive film of the invention has a high transmittance with respect to a wavelength of light used for heating to locally heat the substrate by a pulse laser, thus, a technique for improving displacement of pattern in pattern transfer using a reflective mask by heating with using light can be effectively applied in a reflective mask which is obtained.

DESCRIPTION OF THE PREFERRED EMBODIMENT

A reflective mask blank (an EUV mask blank) of the invention is used as a material for a reflective mask (an EUV mask) used in EUV lithography utilizing EUV light as exposure light. The reflective mask blank can be obtained by forming an absorber film and further one or more optional other films, on a substrate with a film for a reflective mask blank. A wavelength of EUV light used in EUV lithography utilizing EUV light as exposure light is 13 to 14 nm, normally about 13.5 nm.

A substrate with a film for a reflective mask blank of the invention includes a substrate, a multilayer reflection film that is formed at the side of one main surface of the two main surfaces of the substrate, preferably in contact with the substrate, and reflects EUV light, and a back surface conductive film that is formed on the other main surface of the two main surfaces of the substrate, preferably in contact with the substrate. A reflective mask blank of the invention includes a substrate, a multilayer reflection film that is formed at the side of one main surface of the two main surfaces of the substrate, preferably in contact with the substrate, and reflects EUV light, an absorber film that is formed on the multilayer reflection film, and a back surface conductive film that is formed on the other main surface of the two main surfaces of the substrate, preferably in contact with the substrate. The reflective mask blank may be obtained by forming an absorber film and further one or more optional other films, on the substrate with a film for a reflective mask blank. A reflective mask including an absorber pattern (a pattern of the absorber film) can be manufactured from the reflective mask blank with using the reflective mask blank and by patterning the absorber film.

Figure 1A:
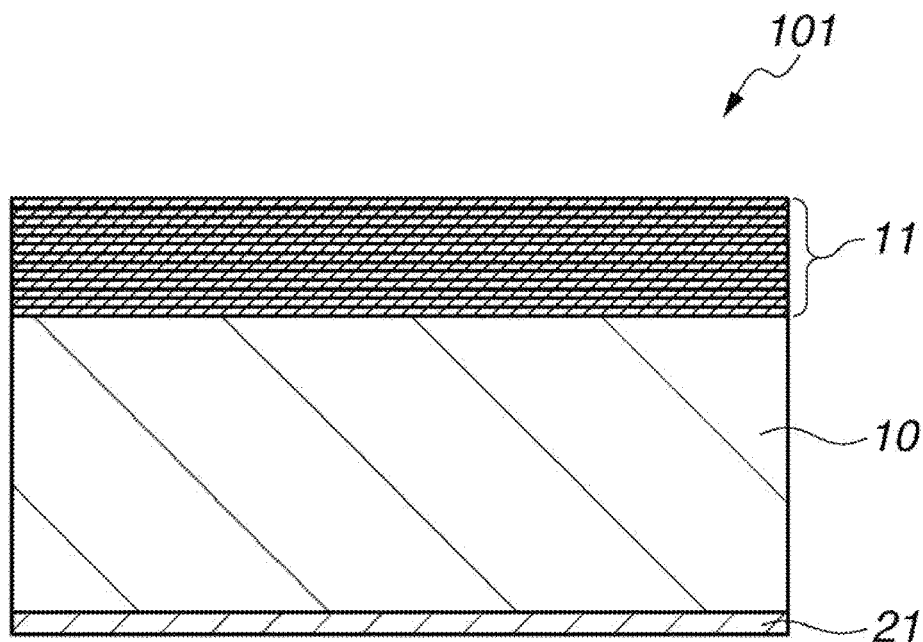
FIGS. 1A and 1B are cross-sectional views illustrating one example of a substrate with a film for a reflective mask blank of the invention, and one example of a reflective mask blank in which an absorber film is formed on the substrate with a film for a reflective mask blank in FIG. 1A, respectively.
Figure 1B:
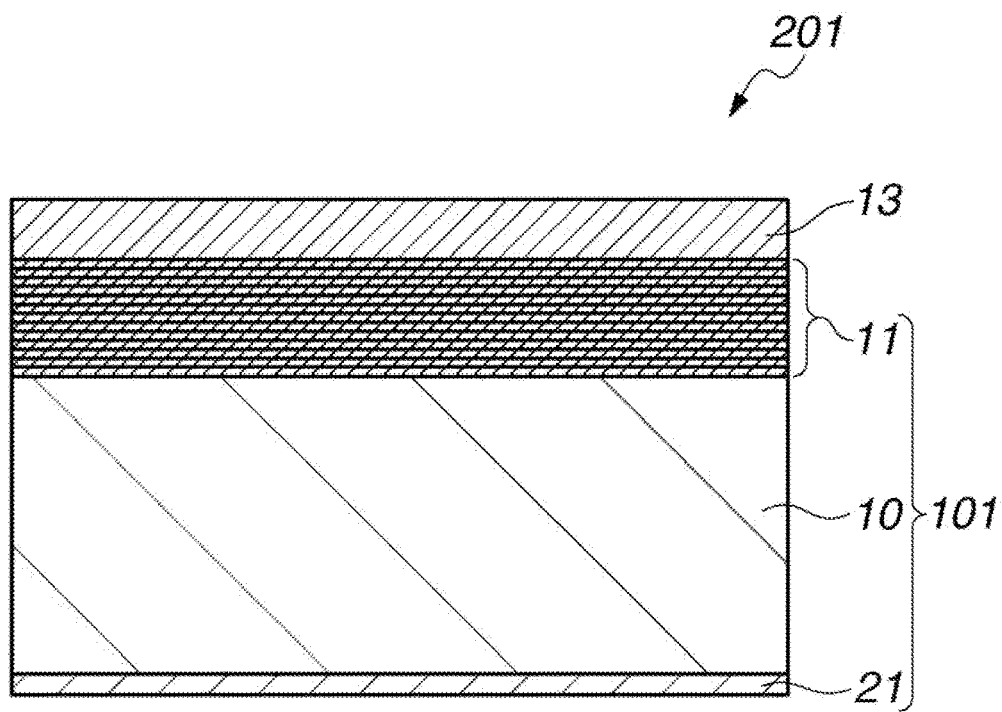

FIGS. 1A and 1B are cross-sectional views illustrating one example of a substrate with a film for a reflective mask blank and one example of a reflective mask blank, respectively. In this case, the substrate with a film for a reflective mask blank 101 shown in FIG. 1A includes a multilayer reflection film 11 formed on one main surface of the substrate 10 and in contact with the main surface, and a back surface conductive film 21 formed on the other main surface of the substrate 10 and in contact with the other main surface. On the other hand, in the reflective mask blank 201 shown in FIG. 1B, an absorber film 13 is formed on the multilayer reflection film 11 and in contact with the multilayer reflection film 11 of the substrate with a film for a reflective mask blank 101 shown in FIG. 1A.

For EUV light exposure, the substrate preferably has low-thermal expansion property. For example, the substrate is preferably composed of a material having a coefficient of thermal expansion within a range of $\pm 2\times 10^{-8}/°$ C., preferably $\pm 5\times 10^{-9}/°$ C. Examples of the materials for the substrate include titania-doped quartz glasses ($SiO_2$—$TiO_2$-based glasses). Further, a substrate having a sufficiently flatted surface is preferably used. A surface roughness of the main surface of the substrate, as an RMS value, is preferably not more than 0.5 nm, more preferably not more than 0.2 nm. Such a surface roughness can be obtained by polishing the substrate. The substrate in the invention is preferably, for example, a substrate having dimensions of 6 inch-square and 0.25 inch-thick, called a 6025 substrate specified by the SEMI standard, which is often denoted by a substrate having dimensions of 152 mm-square, 6.35 mm-thick, according to the SI unit system, however, not limited thereto.

In the invention, the back surface conductive film is constituted so as to have a composition at the side in contact with the substrate, and a different composition at the side remotest from the substrate. The side in contact with the substrate in the back surface conductive film preferably has a high transmittance, particularly a high transmittance with respect to light having a wavelength of 400 to 800 nm, and preferably has a high film stress. On the other hand, it is required that the side remotest from the substrate in the back surface conductive film has a low sheet resistance.

From the viewpoint of improving properties of transmittance and film stress, particularly, from the viewpoint of ensuring a necessary high film stress with forming the back surface conductive film thinner, a composition containing silicon (Si) and nitrogen (N), as main components, is effective for the composition at the side in contact with the substrate. In this case, the composition containing silicon (Si) and nitrogen (N) has a total content of silicon and nitrogen of preferably not less than 70 at %, more preferably not less than 80 at %. Further, in the composition at the side in contact with the substrate, a content of nitrogen to the total of nitrogen and silicon is preferably not less than 53 at %, more preferably not less than 55 at %.

From the viewpoint of further improving properties of transmittance and film stress, further from the viewpoint of improving property of surface roughness, the composition at the side in contact with the substrate may contain at least one element selected from the group consisting of tantalum (Ta), molybdenum (Mo), chromium (Cr), titanium (Ti), zirconium (Zr), niobium (Nb), hafnium (Hf) and tungsten (W). The composition at the side in contact with the substrate may contain either or both of oxygen (O) and carbon (C).

Examples of the compositions at the side in contact with the substrate includes
(1) a composition consisting of silicon and nitrogen,
(2) a composition containing silicon, nitrogen, and either or both of oxygen and carbon, and having a total content of silicon and nitrogen of not less than 70 at %,
(3) a composition containing silicon, nitrogen, and at least one element selected from the group consisting of tantalum, molybdenum, chromium, titanium, zirconium, niobium, hafnium and tungsten, and having a total content of silicon and nitrogen of not less than 70 at %, and (4) a composition containing silicon and nitrogen, at least one element selected from the group consisting of tantalum, molybdenum, chromium, titanium, zirconium, niobium, hafnium and tungsten, and either or both of oxygen and carbon, and having a total content of silicon and nitrogen of not less than 70 at %.

From the viewpoint of improving properties of sheet resistance and hardness, particularly, since the composition containing silicon and nitrogen, as main components, tends to have a high sheet resistance (a low electric conductivity), from the viewpoint of ensuring a sufficiently low sheet resistance needed at the side remotest from the substrate that is the side of the reflective mask to be electrostatic chucked in an exposure apparatus, a composition containing tantalum (Ta) as a main component is effective as the composition at the side remotest from the substrate. In this case, a tantalum content is preferably not less than 60 at %, more preferably not less than 80 at %.

Further, the composition at the side remotest from the substrate preferably contains at least one element selected from the group consisting of silicon (Si), germanium (Ge) and aluminum (Al). A composition having a high tantalum content may cause increase of a surface roughness since tantalum has high crystallinity. In this case, defects may generate with high possibility when the reflective mask is attached to an exposure apparatus by electrostatic chucking, or detached. Therefore, the composition at the side remotest from the substrate preferably contains at least one element selected from the group consisting of silicon, germanium and aluminum to suppress the surface roughness small. When the at least one of these elements is contained, the side remotest from the substrate that contains tantalum as a main component is formed by fine crystalline or amorphous, thus, the surface roughness can be suppressed small. In the case that the at least one element selected from the group consisting of silicon, germanium and aluminum is contained, a content of the element(s) is more than 0 at %, however, preferably not less than 5 at %, more preferably not less than 10 at %.

On the other hand, when the at least one element selected from the group consisting of silicon, germanium and aluminum is contained, the sheet resistance of the composition tends to high compared with that of the composition containing tantalum only. Further, these elements are easily oxidized during heat treatment, and the sheet resistance of the composition may further increase by the oxidation. Therefore, when the at least one element selected from the group consisting of silicon, germanium and aluminum is contained, a content of the element(s) is preferably not more than 40 at %, more preferably not more than 30 at %, even more preferably not more than 20 at %.

Further, the composition at the side remotest from the substrate preferably contains nitrogen (N) and/or oxygen (O), however, a total content of nitrogen and oxygen is preferably not more than 15 at %, more preferably not more than 5 at %. Even more preferably, the composition is substantively free of nitrogen and oxygen, i.e., the composition does not contain nitrogen and oxygen exceeding an amount of impurity. Particularly, since nitrogen contained in the composition tends to increase sheet resistance and to reduce film stress, thus, the composition is substantively free of nitrogen, i.e., the composition does not contain nitrogen exceeding an amount of impurity.

In order to make difference between the composition at the side in contact with the substrate, and the composition at the side remotest from the substrate in the back surface conductive film, the back surface conductive film may be a multilayer film or may be a compositionally graded film which varies the composition in the thickness direction. In the case that the back surface conductive film is a multilayer film, each layer may be a layer having a single composition whose composition is constant in the thickness direction, or may be a compositionally graded layer. Further, in the case that the back surface conductive film is a multilayer film, the back surface conductive film may consist of two or three or more layers, however, the back surface conductive film preferably consists of two layers. In the case that the back surface conductive film consists of two layers, the composition of the layer at the side in contact with the substrate may be the composition at the side in contact with the substrate, and the composition of the layer at the side remotest from the substrate may be the composition at the side remotest from the substrate. The layer at the side remotest from the substrate has a thickness of preferably not less than 10%, more preferably not less than 20%, of the total thickness of the back surface conductive film, and preferably not more than 70%, more preferably not more than 60%, of the total thickness of the back surface conductive film. In particular, the layer at the side remotest from the substrate has a thickness of preferably not less than 5 nm, and preferably not more than 20 nm.

Figure 2A:
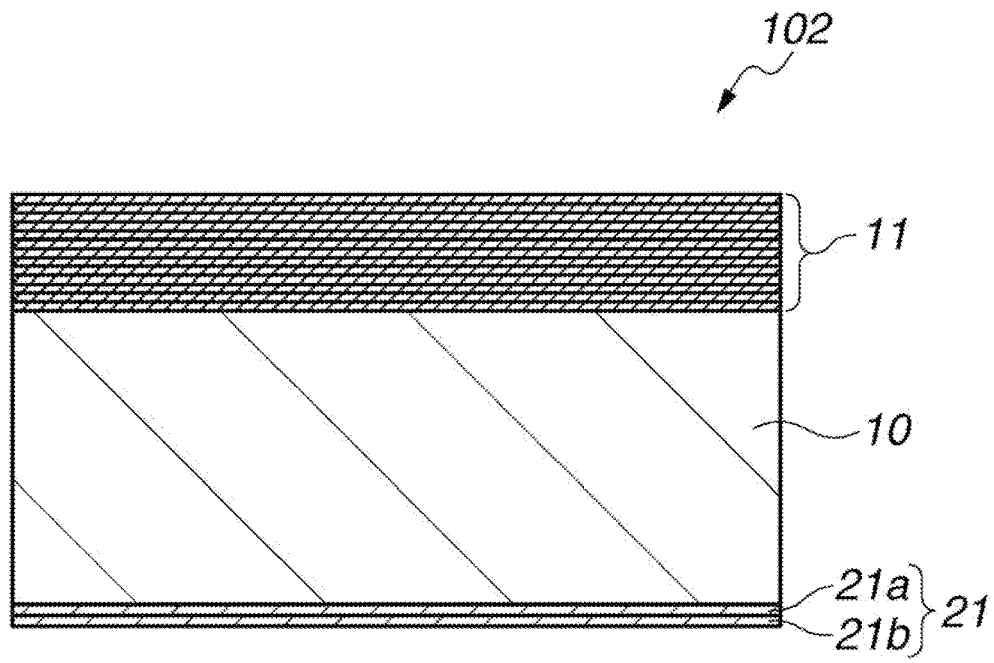
FIGS. 2A and 2B are cross-sectional views illustrating another example of a substrate with a film for a reflective mask blank of the invention, and another example of a reflective mask blank in which an absorber film is formed on the substrate with a film for a reflective mask blank in FIG. 2A, respectively.
Figure 2B:
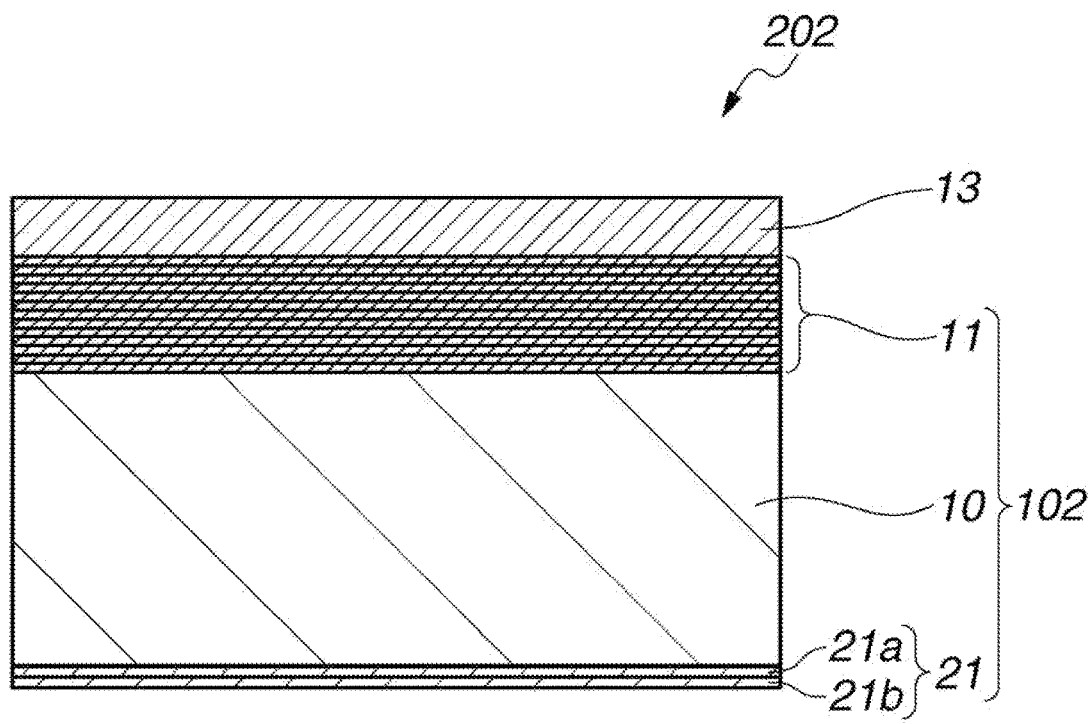

FIGS. 2A and 2B are cross-sectional views illustrating another example of a substrate with a film for a reflective mask blank and another example of a reflective mask blank, respectively. In this case, the substrate with a film for a reflective mask blank 102 shown in FIG. 2A includes a multilayer reflection film 11 formed on one main surface of the substrate 10 and in contact with the main surface, and a back surface conductive film 21 formed on the other main surface of the substrate 10 and in contact with the other main surface. The back surface conductive film 21 consists of two layers of a layer 21a at the side in contact with the substrate, and a layer 21b at the side remotest from the substrate. On the other hand, in the reflective mask blank 202 shown in FIG. 2B, an absorber film 13 is formed on the multilayer reflection film 11 and in contact with the multilayer reflection film 11 of the substrate with a film for a reflective mask blank 102 shown in FIG. 2A.

The back surface conductive film having an advantageous thickness for productivity and suppressing generation of defects, and an effective film stress for reducing deformation of the substrate can be formed by constituting the back surface conductive film so as to have a composition at the side in contact with the substrate, and a different composition at the side remotest from the substrate, and adjusting the composition at the side in contact with the substrate, and the composition at the side remotest from the substrate to predetermined compositions, respectively. Further, the back surface conductive film having a high transmittance with respect a wavelength of light used in heat treatment to the substrate, particularly a wavelength of 400 to 800 nm, can be formed by the compositions. Moreover, the back surface conductive film having a low sheet resistance and a small surface roughness can be formed by constituting the back surface conductive film so as to have a composition at the side in contact with the substrate, and a different composition at the side remotest from the substrate, and adjusting the composition at the side in contact with the substrate, and the composition at the side remotest from the substrate to predetermined compositions, respectively.

It is advantageous that a film thickness of the back surface conductive film is thinner from the viewpoint of productivity of film formation and suppressing particle generation. Further, from the viewpoint of increasing a transmittance, thin film is preferable. In particular, the thickness of the back surface conductive film is preferably not more than 70 nm, more preferably not more than 50 nm. On the other hand, a lower limit of the thickness of the back surface conductive film is preferably not less than 20 nm, more preferably not less than 30 nm.

A warpage of the substrate in the state in which a film is formed on the substrate varies depending on the composition and physical properties of the film. For example, when the substrate has dimensions of 152 mm-square of the main surface and 6.35 mm of thickness (when the substrate is a 6025 substrate), the substrate with a film for a reflective mask blank preferably has an amount of change in warpage (ΔTIR) within a range of −0.3 to +0.3 μm. Here, the amount of change in warpage (ΔTIR) is a difference between a warpage of the one main surface (the main surface at the side on which the multilayer reflection film or the multilayer reflection film and the protection film will be formed) of the substrate before forming the multilayer reflection film or the multilayer reflection film and the protection film, and the back surface conductive film, on the substrate, and another warpage of the one main surface (the main surface at the side on which the multilayer reflection film or the multilayer reflection film and the protection film have been formed) of the substrate after forming the multilayer reflection film or the multilayer reflection film and the protection film, and the back surface conductive film, on the substrate. Therefore, an absolute value of an amount of change in warpage (ΔTIR) between a warpage of the substrate before forming the multilayer reflection film or the multilayer reflection film and the protection film and a warpage of the substrate after forming only the multilayer reflection film or the multilayer reflection film and the protection film is preferably almost the same as an absolute value of an amount of change in warpage (ΔTIR) between a warpage of the substrate before forming the back surface conductive film and a warpage of the substrate after forming only the back surface conductive film. Here, as the warpage, a warpage within a range of 142 mm-square centered on the center of the main surface of the substrate may be applied. The amount of change in warpage (ΔTIR) of the invention is based on, as a reference, the main surface on which the multilayer reflection film or the multilayer reflection film and the protective film have been formed, and in the case that the change in warpage after forming a film to before forming the film is concave direction, the change in warpage is described as plus (+), and in the case that the change in warpage after forming a film to before forming the film is convex direction. the change in warpage is described as minus (−).

To the reflective mask blank, heat treatment is usually performed in advance to the reflective mask blank in consideration of thermal history in processing steps for manufacturing a reflective mask. Generally, a reflectance of the multilayer reflection film reduces when a temperature of the heat treatment is high, thus the temperature of the heat treatment is preferably not more than 150° C. Therefore, the substrate with a film for a reflective mask blank preferably has an amount of change in warpage (ΔTIR) after heat treatment within a range of −0.3 to +0.3 μm. Here, the amount of change in warpage (ΔTIR) is a difference between a warpage of the one main surface (the main surface at the side on which the multilayer reflection film or the multilayer reflection film and the protection film will be formed) of the substrate before forming the multilayer reflection film or the multilayer reflection film and the protection film, and the back surface conductive film, on the substrate, and another warpage of the one main surface (the main surface at the side on which the multilayer reflection film or the multilayer reflection film and the protection film have been formed) of the substrate after forming the multilayer reflection film or the multilayer reflection film and the protection film, and the back surface conductive film, on the substrate, and performing heat treatment at 150° C. for 10 minutes to the substrate.

In the case that a technique for improving displacement of pattern in pattern transfer using a reflective mask is applied after forming the reflective mask from the reflective mask blank, the back surface conductive film preferably has a high transmittance with respect to a wavelength of light used for heating to locally heat the substrate by such as a pulse laser. Therefore, the back surface conductive film of the invention has a transmittance of preferably not less than 10%, more preferably not less than 20%, even more preferably not less than 30%, with respect to light having a wavelength within a range of 400 to 800 nm. The transmittance may be not less than a prescribed value with respect to light having a specified wavelength in the range of 400 to 800 nm, in particular, a wavelength of 532 nm. Particularly, the back surface conductive film preferably has a transmittance of not less than the prescribed value in the whole wavelength in the range of 400 to 800 nm.

The back surface conductive film has a sheet resistance RS of preferably not more than 250 Ω/square, more preferably not more than 100 Ω/square since the back surface conductive film is a film used for electrostatically chucking the reflective mask in an exposure apparatus.

From the viewpoint of suppressing generation of particles in attaching the reflective mask to or detaching the reflective mask from an exposure apparatus, the back surface conductive film preferably has a small surface roughness RMS, and has a surface roughness RMS of preferably not more than 0.5 nm, more preferably not more than 0.3 nm.

The back surface conductive film may be formed before forming the multilayer reflection film, or after forming all the films on the multilayer reflection film side of the substrate. After forming a part of the films at the multilayer reflection film side of the substrate, the back surface conductive film may be formed, and then the remainder of the films on the multilayer reflection film side of the substrate may be formed.

Examples of methods for forming the back surface conductive film include a sputtering method in which, to perform sputtering, power is supplied to a target, and plasma of an atmospheric gas is formed (an atmospheric gas is ionized) by the supplied power, and an ion beam sputtering method in which a target is irradiated with ion beam. The sputtering methods include a DC sputtering method in which a DC voltage is applied to a target, and an RF sputtering method in which a high frequency voltage is applied to a target. The sputtering method is a film forming method that utilizes sputtering phenomenon by gas ions which is generated by applying a voltage to a target with feeding a sputtering gas into a chamber to ionize the gas. Particularly, a magnetron sputtering method has an advantage in productivity. The power may be applied to the target by a DC system or an RF system. The DC system includes also a pulse sputtering in which a negative bias applied to the target is inverted for a short time to prevent charge-up of the target.

The back surface conductive film may be formed by, for example, a sputtering method using a sputtering apparatus to which one target or a plurality of targets can be attached. In particular, the side in contact with the substrate may be formed by using, as a target, a silicon (Si) target or a silicon nitride (SiN) target, and optionally using at least one selected from the group consisting of a tantalum (Ta) target, a molybdenum (Mo) target, a chromium (Cr) target, a titanium (Ti) target, a zirconium (Zr) target, a niobium (Nb) target, a hafnium (Hf) target and a tungsten (W) target, and using, as a sputtering gas, a rare gas such as helium (He) gas, argon (Ar) gas, krypton (Kr) gas and xenon (Xe) gas, and optionally using a nitrogen-containing gas such as nitrogen gas ($N_2$ gas), and further optionally using at least one selected from the group consisting of an oxygen-containing gas such as oxygen gas ($O_2$ gas) and a carbon oxide gas (CO gas, $CO_2$ gas), and a carbon-containing gas such as a carbon oxide gas (CO gas, $CO_2$ gas) and a hydrocarbon gas such as methane ($CH_4$) gas. The sputtering is a reactive sputtering when the nitrogen-containing gas, the oxygen-containing gas or the carbon-containing gas is used.

The side remotest from the substrate may be formed by using, as targets, a tantalum (Ta) target, and at least one target selected from the group consisting of a silicon (Si) target, a germanium (Ga) target and an aluminum (Al) target, and using, as a sputtering gas, a rare gas such as helium (He) gas, argon (Ar) gas, krypton (Kr) gas and xenon (Xe) gas. In this case, at least one selected from the group consisting of a nitrogen-containing gas such as nitrogen gas ($N_2$ gas), an oxygen-containing gas such as oxygen gas ($O_2$ gas) and a carbon oxide gas (CO gas, $CO_2$ gas), and a carbon-containing gas such as a carbon oxide gas (CO gas, $CO_2$ gas) and a hydrocarbon gas such as methane ($CH_4$) gas may be optionally used.

In the back surface conductive film, each of the composition at the side in contact with the substrate, the composition at the side remotest from the substrate, and the other compositions at the other portions can be controlled to desired compositions by appropriately adjusting a power applied to the target (and their ratio when using multiple kinds of targets), a flow rate of reactive gas (and their ratio when using multiple kinds of reactive gases), and other conditions.

The multilayer reflection film is a film that reflects EUV light as exposure light in the reflective mask. The multilayer reflection film consists of multiple layers in which layers composed of a material having a low refractive index and layers composed of a material having a high refractive index are alternately laminated. For EUV light having an exposure wavelength of 13 to 14 nm, for example, a Mo/Si periodically laminated film in which molybdenum (Mo) layers and silicon (Si) layers are alternately laminated in a range of about not less than 40 cycles (not less than 40 layers, respectively) and about not more than 60 cycles (not more than 60 layers, respectively). The multilayer reflection film has usually a thickness of about 280 to 350 nm. Further a SiN layer may be formed between the Mo layer and the Si layer.

Examples of methods for forming the multilayer reflection film include a sputtering method in which, to perform sputtering, power is supplied to a target, and plasma of an atmospheric gas is formed (an atmospheric gas is ionized) by the supplied power, and an ion beam sputtering method in which a target is irradiated with ion beam. As the sputtering method, particularly, a magnetron sputtering method has an advantage in productivity. The power may be applied to the target by a DC system or an RF system. The DC system includes also a pulse sputtering in which a negative bias applied to the target is inverted for a short time to prevent charge-up of the target.

The multilayer reflection film may be formed by, for example, a sputtering method using a sputtering apparatus to which a plurality of targets can be attached. In particular, the multilayer reflection film may be formed by using, as targets, a molybdenum (Mo) target for forming a molybdenum (Mo)-containing layer, and a silicon (Si) target for forming a silicon (Si)-containing layer, and using, as a sputtering gas, a rare gas such as helium (He) gas, argon (Ar) gas, krypton (Kr) gas and xenon (Xe) gas. Further, the sputtering may be a reactive sputtering using a reactive gas. In this case, for example, when a nitrogen (N)-containing film is formed, a nitrogen-containing gas such as nitrogen gas ($N_2$ gas) may be used with the rare gas.

In the case that a layer containing a plurality of elements is formed, a desired composition, and desired physical properties such as crystallinity can be obtained by appropriately adjusting a power applied to the target (and their ratio when using multiple kinds of targets), a flow rate of reactive gas (and their ratio when using multiple kinds of reactive gases), and other conditions.

The absorber film is formed on the multilayer reflection film. The absorber film absorbs EUV light, which is exposure light, and is a film to reduce a reflectance of the exposure light. In the reflective mask, a transfer pattern is formed by the difference in the reflectances between the portion where the absorber film is formed and the portion where the absorber film is not formed. The absorber film is formed on the multilayer reflection film and may be formed in contact with the multilayer reflection film, however, generally, the absorber film is formed via a protection film described below.

A material of the absorber film is not limited as long as the material can absorb EUV light and is processible to a pattern. Examples of the materials of the absorber film include, for example, a material containing tantalum (Ta) or chromium (Cr). The material containing Ta or Cr may contain oxygen (O), nitrogen (N), carbon (C), boron (B), or other elements. Examples of the materials containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the materials containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

The absorber film can be formed by a sputtering method, and the sputtering is preferably a magnetron sputtering. In particular, the absorber film may be formed by a sputtering using a metal target such as a chromium (Cr) target and a tantalum (Ta) target or a metal compound target such as a chromium compound target and a tantalum compound target (a target containing a metal such as Cr and Ta, and at least one element selected from the group consisting of oxygen (O), nitrogen (N), carbon (C) and boron (B)), and using, as a sputtering gas, a rare gas such as helium (He) gas, argon (Ar) gas, krypton (Kr) gas and xenon (Xe) gas, or a reactive sputtering using the target, and the rare gas with a reactive gas such as an oxygen-containing gas, a nitrogen-containing gas and a carbon-containing gas. A thickness of the absorber film is normally about 50 to 90 nm, however, not limited thereto.

Between the multilayer reflection film and the absorber film, a protection film is preferably formed, preferably in contact with the multilayer reflection film, more preferably in contact with both of the multilayer reflection film and the absorber film. The protection film is also called a capping layer, and is formed to protect the multilayer reflection film when the absorber film thereon is patterned or a pattern of the absorber film is corrected.

Figure 3A:
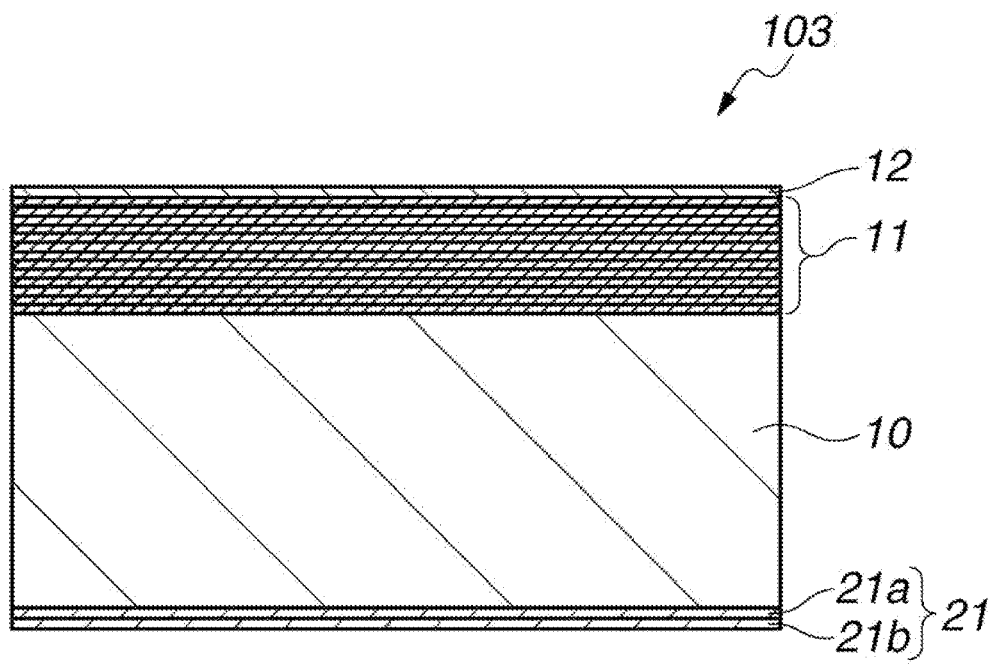
FIGS. 3A and 3B are cross-sectional views illustrating the other example of a substrate with a film for a reflective mask blank of the invention, and the other example of a reflective mask blank in which an absorber film is formed on the substrate with a film for a reflective mask blank in FIG. 3A, respectively.
Figure 3B:
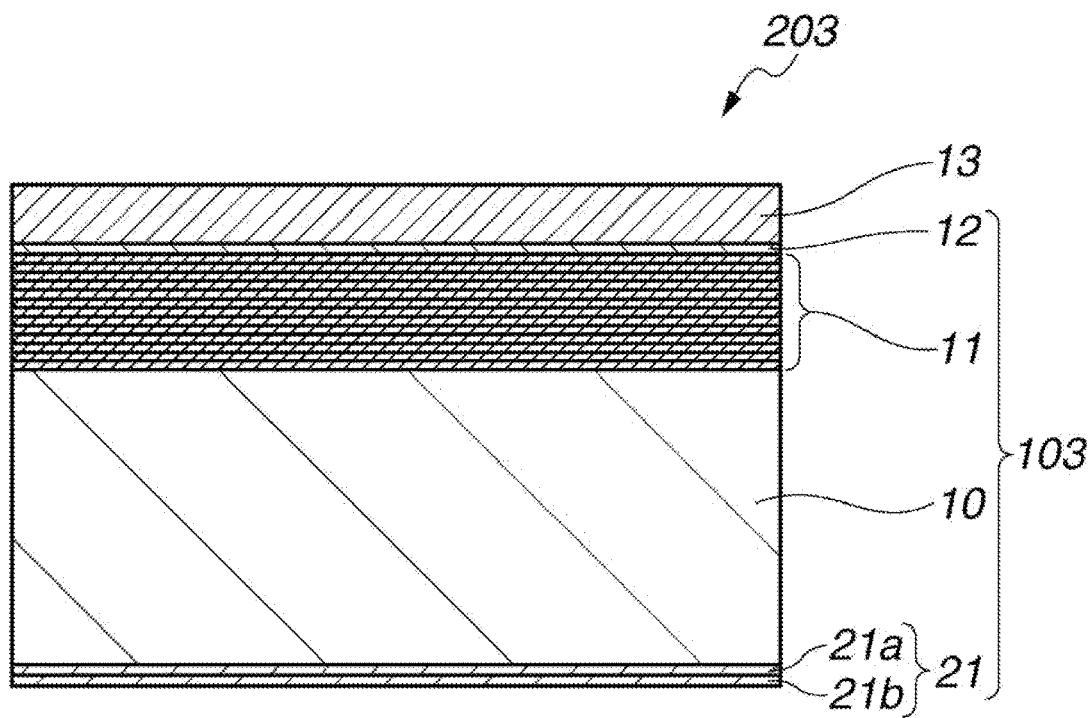

FIGS. 3A and 3B are cross-sectional views illustrating the other example of a substrate with a film for a reflective mask blank and the other example of a reflective mask blank, respectively. In this case, the substrate with a film for a reflective mask blank 103 shown in FIG. 3A includes a multilayer reflection film 11 formed on one main surface of the substrate 10 and in contact with the main surface, a protection film 12 formed in contact with the multilayer reflection film 11, and a back surface conductive film 21 formed on the other main surface of the substrate 10 and in contact with the other main surface. The back surface conductive film 21 consists of two layers of a layer 21a at the side in contact with the substrate, and a layer 21b at the side remotest from the substrate. On the other hand, in the reflective mask blank 203 shown in FIG. 3B, an absorber film 13 is formed on the protection film 12 and in contact with the protection film 12 of the substrate with a film for a reflective mask blank 103 shown in FIG. 3A.

A material for the protection film is preferably a material containing ruthenium (Ru). Aa the material containing ruthenium (Ru), ruthenium (Ru) simple substance, or a compound of ruthenium (Ru) added with niobium (Nb) or zirconium (Zr) is preferably used. The protection film has a thickness of normally not more than 5 nm, particularly not more than 4 nm. A lower limit of the thickness of the protection film is normally not less than 2 nm.

As same as the multilayer reflection film, the protection film can be formed by a sputtering method such as an ion beam sputtering method or a magnetron sputtering method. The protection film may be formed by, for example, a sputtering method using a sputtering apparatus to which one or a plurality of targets can be attached. In particular, the protection film may be formed by sputtering using a target selected from the group consisting of a ruthenium (Ru) target, a ruthenium (Ru) target added with niobium (Nb) or zirconium (Zr), and an optional target of at least one element selected from the group consisting of niobium (Nb) and zirconium (Zr), and using, as a sputtering gas, a rare gas such as helium (He) gas, argon (Ar) gas, krypton (Kr) gas and xenon (Xe) gas.

When the protection film is formed of a compound containing an element other than a metal, the protection film can be formed by reactive sputtering using, as the sputtering gas, a reactive gas such as an oxygen-containing gas, a nitrogen-containing gas, or a carbon-containing gas with the rare gas. Further, the target may be a compound.

At the side remote from the substrate on the absorber film, a hard mask film (an etching mask film for the absorber film that acts as etching mask during dry etching the absorber film) having different etching properties from the absorber film may be formed, preferably in contact with the absorber film. The hard mask film is a film that acts as an etching mask when an absorber film is dry-etched. After the absorber pattern is formed, the hard mask film may be left as, for example, a reflectance reducing film for reducing the reflectance at a wavelength of light used in inspections such as pattern inspection and as a part of the absorber film, or may be removed to be absent on the reflective mask. Examples of the materials of the hard mask film include a material containing chromium (Cr). Particularly, a hard mask film composed of a material containing Cr is preferable in the case that the absorber film is composed of a material containing Ta and free of Cr. When a layer that mainly assumes a function for reducing the reflectance at a wave-length of light used in inspection such as pattern inspection (a reflectance reducing layer) is formed on the absorber film, the hard mask film may be formed on the reflectance reducing layer of the absorber film. The hard mask film may be formed by, for example, a magnetron sputtering method. A thickness of the hard mask is normally about 5 to 20 nm, however, not limited thereto.

Further, the reflective mask blank may include a resist film formed on the side remotest from the substrate. The resist film is preferably an electron beam (EB) resist.

EXAMPLES

Examples of the invention are given below by way of illustration and not by way of limitation.

Experimental Example 1

A low-thermal expansion substrate ($SiO_2$—$TiO_2$-based glass substrate) having dimensions of 152 mm-square and 6.35 mm-thick was prepared. A warpage (TIR) of one main surface of the substrate was measured by Photomask Form Analysis System, Ultra-Flat200-ERA (manufactured by Corning Tropel). The same system was used in the following measurements of TIR.

Next, a multilayer reflection film was formed on the one main surface whose warpage was measured, of the low-thermal expansion substrate while rotating the substrate by DC pulse magnetron sputtering with using a molybdenum (Mo) target and a silicon (Si) target that were placed so as to face to the main surface of the substrate. Each of the targets was attached to a sputtering apparatus that is capable of attaching the molybdenum (Mo) target and the silicon (Si) target and discharging the targets individually, or two or more of the targets at the same time, and the substrate was placed into the sputtering apparatus.

First, a silicon (Si) layer having a thickness of 4.2 nm was formed under sputtering pressure of 0.025 Pa with applying an electric power to the silicon (Si) target while feeding argon (Ar) gas (flow rate: 12 sccm) into a chamber. Next, a molybdenum (Mo) layer having a thickness of 2.8 nm was formed under sputtering pressure of 0.026 Pa with applying an electric power to the molybdenum (Mo) target while feeding argon (Ar) gas (flow rate: 13 sccm) into the chamber.

The one cycle which is a set of the formations of the Si layer and the Mo layer was repeated for 40 cycles to form 40 layers of the Si layer and the Mo layer, respectively. Finally, a silicon (Si) layer having a thickness of 4.2 nm was formed under sputtering pressure of 0.025 Pa with applying an electric power to the silicon (Si) target while feeding argon (Ar) gas (flow rate: 12 sccm) into the chamber. Accordingly, a multilayer reflection film having a thickness of 284.2 nm was formed.

Next, on the multilayer reflection film, a protection film was formed in contact with the multilayer reflection film while rotating the substrate by DC pulse magnetron sputtering with using a ruthenium (Ru) target that was placed so as to face to the main surface of the substrate. The ruthenium (Ru) target was attached to another sputtering apparatus that differs from the sputtering apparatus in which the multilayer reflection film was formed, and the substrate having the formed multilayer reflection film was transported without taking it out to the atmosphere, from the sputtering apparatus in which the multilayer reflection film was formed, through a transport path which was maintained in vacuum condition, to the other sputtering apparatus to which the ruthenium (Ru) target was attached, and was placed into the other sputtering apparatus.

A ruthenium (Ru) film having a thickness of 2.0 nm was formed under sputtering pressure of 0.023 Pa with applying an electric power to the ruthenium (Ru) target while feeding argon (Ar) gas (flow rate: 10 sccm) into a chamber, then, the application of electric power to the ruthenium (Ru) target was terminated. Accordingly, a protection film consisting of a single layer was formed.

A warpage (TIR) of the main surface at the side on which the multilayer reflection film and the protection film had been formed (the one main surface) was measured. A ΔTIR which is a difference between the obtained warpage (TIR), and the warpage (TIR) of the main surface at the same side (the one main surface) that was initially measured before forming the multilayer reflection film and the protection film was calculated. As a result, the ΔTIR was −1.10 μm.

Next, the substrate on which the multilayer reflection film and the protection film had been formed was heat treated at 150° C. for 10 minutes by a hot plate type heat treatment equipment. After that, a warpage (TIR) of the main surface at the side on which the multilayer reflection film and the protection film had been formed (the one main surface) was measured again. A ΔTIR which is a difference between the obtained warpage (TIR), and the warpage (TIR) of the main surface at the same side (the one main surface) that was initially measured before forming the multilayer reflection film and the protection film was calculated. As a result, the ΔTIR was −0.80 μm.

Experimental Example 2

A low-thermal expansion substrate ($SiO_2$—$TiO_2$-based glass substrate) having dimensions of 152 mm-square and 6.35 mm-thick was prepared. A warpage (TIR) of one main surface of the substrate was measured.

Next, a multilayer reflection film was formed on the one main surface whose warpage was measured, of the low-thermal expansion substrate while rotating the substrate by DC pulse magnetron sputtering with using a molybdenum (Mo) target and a silicon (Si) target that were placed so as to face to the main surface of the substrate. Each of the targets was attached to a sputtering apparatus that is capable of attaching the molybdenum (Mo) target and the silicon (Si) target and discharging the targets individually, or two or more of the targets at the same time, and the substrate was placed into the sputtering apparatus.

First, a silicon (Si) layer having a thickness of 3.7 nm was formed under sputtering pressure of 0.025 Pa with applying an electric power to the silicon (Si) target while feeding argon (Ar) gas (flow rate: 12 sccm) into a chamber. Next, a silicon nitride (SiN) layer having a thickness of 0.5 nm was formed under sputtering pressure of 0.15 Pa with applying an electric power to the silicon (Si) target while feeding argon (Ar) gas (flow rate: 12 sccm) and nitrogen ($N_2$) gas (flow rate: 50 sccm) into the chamber. Next, a molybdenum (Mo) layer having a thickness of 2.8 nm was formed under sputtering pressure of 0.026 Pa with applying an electric power to the molybdenum (Mo) target while feeding argon (Ar) gas (flow rate: 13 sccm) into the chamber.

The one cycle which is a set of the formations of the Si layer, the SiN layer and the Mo layer was repeated for 40 cycles to form 40 layers of the Si layer, the SiN layer and the Mo layer, respectively. Finally, a silicon (Si) layer having a thickness of 4.2 nm was formed under sputtering pressure of 0.025 Pa with applying an electric power to the silicon (Si) target while feeding argon (Ar) gas (flow rate: 12 sccm) into the chamber. Accordingly, a multilayer reflection film having a thickness of 284.2 nm was formed.

Next, on the multilayer reflection film, a protection film was formed in contact with the multilayer reflection film while rotating the substrate by DC pulse magnetron sputtering with using a ruthenium (Ru) target that was placed so as to face to the main surface of the substrate. The ruthenium (Ru) target was attached to another sputtering apparatus that differs from the sputtering apparatus in which the multilayer reflection film was formed, and the substrate having the formed multilayer reflection film was transported without taking it out to the atmosphere, from the sputtering apparatus in which the multilayer reflection film was formed, through a transport path which was maintained in vacuum condition, to the other sputtering apparatus to which the ruthenium (Ru) target was attached, and was placed into the sputtering apparatus.

A ruthenium (Ru) film having a thickness of 2.0 nm was formed under sputtering pressure of 0.023 Pa with applying an electric power to the ruthenium (Ru) target while feeding argon (Ar) gas (flow rate: 10 sccm) into a chamber, then, the application of electric power to the ruthenium (Ru) target was terminated. Accordingly, a protection film consisting of a single layer was formed.

A warpage (TIR) of the main surface at the side on which the multilayer reflection film and the protection film had been formed (the one main surface) was measured. A ΔTIR which is a difference between the obtained warpage (TIR), and the warpage (TIR) of the main surface at the same side (the one main surface) that was initially measured before forming the multilayer reflection film and the protection film was calculated. As a result, the ΔTIR was −0.70 μm.

Next, the substrate on which the multilayer reflection film and the protection film had been formed was heat treated at 150° C. for 10 minutes by a hot plate type heat treatment equipment. After that, a warpage (TIR) of the main surface at the side on which the multilayer reflection film and the protection film had been formed (the one main surface) was measured again. A ΔTIR which is a difference between the obtained warpage (TIR), and the warpage (TIR) of the main surface at the same side (the one main surface) that was initially measured before forming the multilayer reflection film and the protection film was calculated. As a result, the ΔTIR was −0.40 μm.

EXAMPLE 1

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 1.

Next, a warpage (TIR) of the main surface at the side on which the multilayer reflection film and the protection film had been formed (the one main surface) was measured. Next, a back surface conductive film was formed on the other main surface of the low-thermal expansion substrate while rotating the substrate by DC pulse magnetron sputtering with using a tantalum (Ta) target and a silicon (Si) target that were placed so as to face to the main surface of the substrate. Each of the targets was attached to a sputtering apparatus that is capable of attaching the tantalum (Ta) target and the silicon (Si) target and discharging the targets individually, or two or more of the targets at the same time, and the substrate was placed into the sputtering apparatus.

First, a SiNTa layer having a thickness of 30 nm was formed with applying electric powers to the tantalum (Ta) target (300 W) and the silicon (Si) target (1,500 W) while feeding argon (Ar) gas (flow rate: 10 sccm) and nitrogen ($N_2$) gas (flow rate: 40 sccm) into a chamber. Next, a TaSi layer having a thickness of 20 nm was formed with applying electric powers to the tantalum (Ta) target (600 W) and the silicon (Si) target (60 W) while feeding argon (Ar) gas (flow rate: 18 sccm) only into the same chamber. Accordingly, a back surface conductive film consisting of two layers of the SiNTa layer at the side in contact with the substrate and the TaSi layer at the side remotest from the substrate, and having a thickness of 50 nm was obtained.

A composition of the back surface conductive film was measured by X-ray photoelectron spectroscopy (XPS). The layer at the side in contact with the substrate had a silicon content of 41 at %, a nitrogen content of 51 at % and a tantalum content of 8 at %. The layer at the side remotest from the substrate had a tantalum content of 90 at % and a silicon content of 10 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.82 μm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.28 μm. Further, the back surface conductive film had a sheet resistance RS of 97 Ω/square.

A transmittance of the back surface conductive film was measured by a UV spectroscope, Solidspec-3700 (manufactured by Shimadzu Corporation), and was not less than 10% within the whole range of 400 to 800 nm, specially 11.2% with respect to light having a wavelength of 532 nm. A surface roughness RMS of the back surface conductive film was measured by an atomic force microscope (AFM), and was 0.28 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was +0.02 μm. Further, the back surface conductive film after heat treatment had a sheet resistance RS of 100 Ω/square.

EXAMPLE 2

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiNTa layer having a thickness of 30 nm was formed with applying electric powers to the tantalum (Ta) target (300 W) and the silicon (Si) target (1,500 W) while feeding argon (Ar) gas (flow rate: 10 sccm) and nitrogen ($N_2$) gas (flow rate: 40 sccm) into a chamber. Next, a TaSiN layer having a thickness of 20 nm was formed with applying electric powers to the tantalum (Ta) target (600 W) and the silicon (Si) target (60 W) while feeding argon (Ar) gas (flow rate: 18 sccm) and nitrogen ($N_2$) gas (flow rate: 5 sccm) into the same chamber. Accordingly, a back surface conductive film consisting of two layers of the SiNTa layer at the side in contact with the substrate and the TaSiN layer at the side remotest from the substrate, and having a thickness of 50 nm was obtained.

A composition of the back surface conductive film was measured as the same manner in Example 1. The layer at the side in contact with the substrate had a silicon content of 41 at %, a nitrogen content of 51 at % and a tantalum content of 8 at %. The layer at the side remotest from the substrate had a tantalum content of 84 at %, a silicon content of 4 at % and a nitrogen content of 12 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.69 μm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.01 μm. Further, the back surface conductive film had a sheet resistance RS of 130 Ω/square.

A transmittance of the back surface conductive film was measured as the same manner in Example 1, and was not less than 12% within the whole range of 400 to 800 nm, specially 13.0% with respect to light having a wavelength of 532 nm. A surface roughness RMS of the back surface conductive film was measured as the same manner in Example 1, and was 0.21 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was +0.28 µm. Further, the back surface conductive film after heat treatment had a sheet resistance RS of 130 Ω/square.

EXAMPLE 3

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiNTa layer having a thickness of 22 nm was formed with applying electric powers to the tantalum (Ta) target (150 W) and the silicon (Si) target (1,650 W) while feeding xenon (Xe) gas (flow rate: 1.4 sccm) and nitrogen ($N_2$) gas (flow rate: 40 sccm) into a chamber. Next, a TaSi layer having a thickness of 12 nm was formed with applying electric powers to the tantalum (Ta) target (600 W) and the silicon (Si) target (60 W) while feeding argon (Ar) gas (flow rate: 18 sccm) only into the same chamber. Accordingly, a back surface conductive film consisting of two layers of the SiNTa layer at the side in contact with the substrate and the TaSi layer at the side remotest from the substrate, and having a thickness of 34 nm was obtained.

A composition of the back surface conductive film was measured as the same manner in Example 1. The layer at the side in contact with the substrate had a silicon content of 44 at %, a nitrogen content of 52 at % and a tantalum content of 4 at %. The layer at the side remotest from the substrate had a tantalum content of 90 at % and a silicon content of 10 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.54 µm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.16 µm. Further, the back surface conductive film had a sheet resistance RS of 185 Ω/square.

A transmittance of the back surface conductive film was measured as the same manner in Example 1, and was not less than 21% within the whole range of 400 to 800 nm, specially 21.7% with respect to light having a wavelength of 532 nm. A surface roughness RMS of the back surface conductive film was measured as the same manner in Example 1, and was 0.20 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was +0.14 µm. Further, the back surface conductive film after heat treatment had a sheet resistance RS of 197 Ω/square.

EXAMPLE 4

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiN layer having a thickness of 20 nm was formed with applying an electric power to the silicon (Si) target (1,800 W) only while feeding xenon (Xe) gas (flow rate: 1.4 sccm) and nitrogen ($N_2$) gas (flow rate: 40 sccm) into a chamber. Next, a TaSi layer having a thickness of 20 nm was formed with applying electric powers to the tantalum (Ta) target (600 W) and the silicon (Si) target (60 W) while feeding argon (Ar) gas (flow rate: 18 sccm) only into the same chamber. Accordingly, a back surface conductive film consisting of two layers of the SiN layer at the side in contact with the substrate and the TaSi layer at the side remotest from the substrate, and having a thickness of 40 nm was obtained.

A composition of the back surface conductive film was measured as the same manner in Example 1. The layer at the side in contact with the substrate had a silicon content of 47 at % and a nitrogen content of 53 at %. The layer at the side remotest from the substrate had a tantalum content of 90 at % and a silicon content of 10 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.51 µm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.19 μm. Further, the back surface conductive film had a sheet resistance RS of 100 Ω/square.

A transmittance of the back surface conductive film was measured as the same manner in Example 1, and was not less than 11% within the whole range of 400 to 800 nm, specially 11.0% with respect to light having a wavelength of 532 nm. A surface roughness RMS of the back surface conductive film was measured as the same manner in Example 1, and was 0.24 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was +0.13 μm. Further, the back surface conductive film after heat treatment had a sheet resistance RS of 111 Ω/square.

EXAMPLE 5

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiNTa layer having a thickness of 16 nm was formed with applying electric powers to the tantalum (Ta) target (300 W) and the silicon (Si) target (1,500 W) while feeding argon (Ar) gas (flow rate: 10 sccm) and nitrogen ($N_2$) gas (flow rate: 40 sccm) into a chamber. Next, a TaSi layer having a thickness of 20 nm was formed with applying electric powers to the tantalum (Ta) target (480 W) and the silicon (Si) target (180 W) while feeding argon (Ar) gas (flow rate: 18 sccm) only into the same chamber. Accordingly, a back surface conductive film consisting of two layers of the SiNTa layer at the side in contact with the substrate and the TaSi layer at the side remotest from the substrate, and having a thickness of 36 nm was obtained.

A composition of the back surface conductive film was measured as the same manner in Example 1. The layer at the side in contact with the substrate had a silicon content of 41 at %, a nitrogen content of 51 at % and a tantalum content of 8 at %. The layer at the side remotest from the substrate had a tantalum content of 80 at % and a silicon content of 20 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.41 μm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.29 μm. Further, the back surface conductive film had a sheet resistance RS of 123 Ω/square.

A transmittance of the back surface conductive film was measured as the same manner in Example 1, and was not less than 13% within the whole range of 400 to 800 nm, specially 13.4% with respect to light having a wavelength of 532 nm. A surface roughness RMS of the back surface conductive film was measured as the same manner in Example 1, and was 0.22 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was 0 μm. Further, the back surface conductive film after heat treatment had a sheet resistance RS of 129 Ω/square.

COMPARATIVE EXAMPLE 1

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiNTa layer having a thickness of 17 nm was formed with applying electric powers to the tantalum (Ta) target (15,000 W) and the silicon (Si) target (300 W) while feeding argon (Ar) gas (flow rate: 10 sccm) and nitrogen ($N_2$) gas (flow rate: 40 sccm) into a chamber. Next, a TaSi layer having a thickness of 20 nm was formed with applying electric powers to the tantalum (Ta) target (600 W) and the silicon (Si) target (60 W) while feeding argon (Ar) gas (flow rate: 18 sccm) only into the same chamber. Accordingly, a back surface conductive film consisting of two layers of the SiNTa layer at the side in contact with the substrate and the TaSi layer at the side remotest from the substrate, and having a thickness of 37 nm was obtained.

A composition of the back surface conductive film was measured as the same manner in Example 1. The layer at the side in contact with the substrate had a silicon content of 10 at %, a nitrogen content of 43 at % and a tantalum content of 47 at %. The layer at the side remotest from the substrate had a tantalum content of 90 at % and a silicon content of 10 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.49 µm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.21 µm. Further, the back surface conductive film had a sheet resistance RS of 85 Ω/square.

A transmittance of the back surface conductive film was measured as the same manner in Example 1, and was less than 10% within the whole range of 400 to 800 nm, specially 8.8% with respect to light having a wavelength of 532 nm. A surface roughness RMS of the back surface conductive film was measured as the same manner in Example 1, and was 0.22 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was +0.11 µm. Further, the back surface conductive film after heat treatment had a sheet resistance RS of 96 Ω/square.

COMPARATIVE EXAMPLE 2

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiNTa layer having a thickness of 20 nm was formed with applying electric powers to the tantalum (Ta) target (300 W) and the silicon (Si) target (1,500 W) while feeding argon (Ar) gas (flow rate: 10 sccm) and nitrogen ($N_2$) gas (flow rate: 40 sccm) into a chamber. Next, a Ta layer having a thickness of 20 nm was formed with applying an electric power to the tantalum (Ta) target (660 W) only while feeding argon (Ar) gas (flow rate: 18 sccm) only into the same chamber. Accordingly, a back surface conductive film consisting of two layers of the SiNTa layer at the side in contact with the substrate and the Ta layer at the side remotest from the substrate, and having a thickness of 40 nm was obtained.

A composition of the back surface conductive film was measured as the same manner in Example 1. The layer at the side in contact with the substrate had a silicon content of 41 at %, a nitrogen content of 51 at % and a tantalum content of 8 at %. The layer at the side remotest from the substrate contained tantalum only, and substantively, no other elements were contained.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.67 µm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.03 µm. Further, the back surface conductive film had a sheet resistance RS of 82 Ω/square.

A transmittance of the back surface conductive film was measured as the same manner in Example 1, and was less than 10% within the whole range of 400 to 800 nm, specially 8.4% with respect to light having a wavelength of 532 nm. A surface roughness RMS of the back surface conductive film was measured as the same manner in Example 1, and was 0.35 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was +0.27 µm. Further, the back surface conductive film after heat treatment had a sheet resistance RS of 84 Ω/square.

COMPARATIVE EXAMPLE 3

A low-thermal expansion substrate ($SiO_2$—$TiO_2$-based glass substrate) having dimensions of 152 mm-square and 6.35 mm-thick was prepared. A warpage (TIR) of one main surface of the substrate was measured. A multilayer reflection film and a protection film were formed on the main surface whose warpage (TIR) was measured, of the low-thermal expansion substrate, as the same manner in Experimental Example 2.

Next, a warpage (TIR) of the main surface at the side on which the multilayer reflection film and the protection film had been formed (the one main surface) was measured. Next, a back surface conductive film was formed on the other main surface of the low-thermal expansion substrate, by the same apparatus and as the same manner in Example 1.

First, a SiNTaO layer having a thickness of 21 nm was formed with applying electric powers to the tantalum (Ta) target (300 W) and the silicon (Si) target (1,500 W) while feeding argon (Ar) gas (flow rate: 10 sccm), nitrogen ($N_2$) gas (flow rate: 40 sccm) and oxygen ($O_2$) gas (flow rate: 10 sccm) into a chamber. Next, a TaSiN layer having a thickness of 20 nm was formed with applying electric powers to the tantalum (Ta) target (600 W) and the silicon (Si) target (60 W) while feeding argon (Ar) gas (flow rate: 18 sccm) and nitrogen ($N_2$) gas (flow rate: 5 sccm) into the same chamber. Accordingly, a back surface conductive film consisting of two layers of the SiNTaO layer at the side in contact with the substrate and the TaSiN layer at the side remotest from the substrate, and having a thickness of 41 nm was obtained.

A composition of the back surface conductive film was measured as the same manner in Example 1. The layer at the side in contact with the substrate had a silicon content of 33 at %, a nitrogen content of 16 at %, a tantalum content of 7 at % and an oxygen content of 44 at %. The layer at the side remotest from the substrate had a tantalum content of 87 at %, a silicon content of 5 at % and a nitrogen content of 8 at %.

Next, a warpage (TIR) of the main surface at the side on which the multilayer reflection film and the protection film had been formed (the one main surface) after forming the back surface conductive film was measured. A ΔTIR which is a difference between the obtained warpage (TIR), and the warpage (TIR) of the main surface at the same side (the one main surface) that was measured just before forming the back surface conductive film was calculated. As a result, the ΔTIR was +0.35 μm. On the other hand, a ΔTIR which is a difference between the warpage (TIR) of the main surface at the side on which the multilayer reflection film and the protection film had been formed (the one main surface) after forming the back surface conductive film, and the warpage (TIR) of the main surface at the same side (the one main surface) that was initially measured before forming the multilayer reflection film, the protection film and the back surface conductive film was calculated. As a result, the ΔTIR was −0.35 μm. Further, the back surface conductive film had a sheet resistance RS of 99 Ω/square.

A transmittance of the back surface conductive film was measured as the same manner in Example 1, and was not less than 12% within the whole range of 400 to 800 nm, specially 12.8% with respect to light having a wavelength of 532 nm. A surface roughness RMS of the back surface conductive film was measured as the same manner in Example 1, and was 0.23 nm.

Next, the substrate on which the back surface conductive film had been formed was heat treated at 150° C. for 10 minutes by a hot plate type heat treatment equipment. After that, a warpage (TIR) of the main surface at the side on which the multilayer reflection film and the protection film had been formed (the one main surface) after forming the back surface conductive film and performing heat treatment was measured again. A ΔTIR which is a difference between the obtained warpage (TIR), and the warpage (TIR) of the main surface at the same side (the one main surface) that was initially measured before forming the multilayer reflection film, the protection film and the back surface conductive film was calculated. As a result, the ΔTIR was −0.41 μm. Further, the back surface conductive film after heat treatment had a sheet resistance RS of 100 Ω/square.

Japanese Patent Application No. 2021-162855 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A substrate with a film for a reflective mask blank comprising a substrate, a multilayer reflection film formed at the side of one main surface of the two main surfaces of the substrate, and configured to reflect EUV light, and a back surface conductive film formed in contact with the other main surface of the two main surfaces, wherein
    the back surface conductive film has a first composition at the side in contact with the substrate, and a different composition at the side remotest from the substrate,
    the first composition at the side in contact with the substrate i) consists of silicon and nitrogen, ii) comprises silicon, nitrogen, and either or both of oxygen and carbon, and has a total content of silicon and nitrogen of not less than 70 at %, iii) comprises silicon, nitrogen, and at least one element selected from the group consisting of tantalum, molybdenum, chromium, titanium, zirconium, niobium, hafnium and tungsten, and has a total content of silicon and nitrogen of not less than 70 at %, or iv) comprises silicon and nitrogen, at least one element selected from the group consisting of tantalum, molybdenum, chromium, titanium, zirconium, niobium, hafnium and tungsten, and either or both of oxygen and carbon, and has a total content of silicon and nitrogen of not less than 70 at %,
    the different composition at the side remotest from the substrate comprises tantalum, and at least one element selected from the group consisting of silicon, germanium and aluminum, and has a tantalum content of not less than 60 at % and a total content of nitrogen and oxygen of not more than 15 at %, and
    the back surface conductive film has a thickness of not more than 50 nm.

2. The substrate with a film for a reflective mask blank of claim 1 wherein in the first composition at the side in contact with the substrate, a content of nitrogen to the total of nitrogen and silicon is not less than 53 at %.

3. The substrate with a film for a reflective mask blank of claim 1 wherein the back surface conductive film consists of a plurality of layers, and the layer at the side remotest from the substrate has a thickness of not less than 5 nm and not more than 20 nm.

4. The substrate with a film for a reflective mask blank of claim 1 wherein the back surface conductive film consists of a plurality of layers.

5. The substrate with a film for a reflective mask blank of claim 1 further comprising a protection film formed on the multilayer reflection film.

6. The substrate with a film for a reflective mask blank of claim 1 wherein the substrate has dimensions of 152 mm-square of the main surface and 6.35 mm of thickness, and
an amount of change in warpage ($\Delta$TIR) is within a range of −0.3 to +0.3 μm, wherein
the amount of change in warpage ($\Delta$TIR) is a difference between a warpage of the one main surface of the substrate before forming the multilayer reflection film or the multilayer reflection film and the protection film, and the back surface conductive film, on the substrate, and another warpage of the one main surface of the substrate after forming the multilayer reflection film or the multilayer reflection film and the protection film, and the back surface conductive film, on the substrate.

7. The substrate with a film for a reflective mask blank of claim 1 wherein
the substrate has dimensions of 152 mm-square of the main surface and 6.35 mm of thickness, and
an amount of change in warpage ($\Delta$TIR) is within a range of −0.3 to +0.3 μm, wherein
the amount of change in warpage ($\Delta$TIR) is a difference between a warpage of the one main surface of the substrate before forming the multilayer reflection film or the multilayer reflection film and the protection film, and the back surface conductive film, on the substrate, and another warpage of the one main surface of the substrate after forming the multilayer reflection film or the multilayer reflection film and the protection film, and the back surface conductive film, on the substrate, and performing heat treatment at 150° C. for 10 minutes to the substrate.

8. The substrate with a film for a reflective mask blank of claim 1 wherein the back surface conductive film has a transmittance of not less than 10% with respect to light having a wavelength within a range of 400 to 800 nm.

9. The substrate with a film for a reflective mask blank of claim 1 wherein the back surface conductive film has a sheet resistance RS of not more than 250 Ω/square.

10. The substrate with a film for a reflective mask blank of claim 1 wherein the back surface conductive film has a surface roughness RMS of not more than 0.3 nm.

11. A reflective mask blank in which an absorber film is formed on the multilayer reflection film of the substrate with a film for a reflective mask blank of claim 1.

12. A method for manufacturing a reflective mask by patterning the reflective mask blank of claim 11.

* * * * *